(12) United States Patent
Hiller

(10) Patent No.: US 11,152,555 B2
(45) Date of Patent: Oct. 19, 2021

(54) UNDERWATER ENERGY HARVESTING DRONE AND METHOD FOR OPERATION

(71) Applicant: The Boeing Company, Chicago, IL (US)

(72) Inventor: Nathan D. Hiller, Irvine, CA (US)

(73) Assignee: The Boeing Company, Chicago, IL (US)

( * ) Notice: Subject to any disclaimer, the term of this patent is extended or adjusted under 35 U.S.C. 154(b) by 49 days.

(21) Appl. No.: 15/894,613

(22) Filed: Feb. 12, 2018

(65) Prior Publication Data

US 2019/0252592 A1    Aug. 15, 2019

(51) Int. Cl.
| | |
|---|---|
| *B63G 8/00* | (2006.01) |
| *H01L 35/30* | (2006.01) |
| *H01L 35/00* | (2006.01) |
| *B63G 8/22* | (2006.01) |
| *H01L 35/32* | (2006.01) |
| *H02K 5/132* | (2006.01) |
| *B63B 35/44* | (2006.01) |

(52) U.S. Cl.
CPC ............... *H01L 35/30* (2013.01); *B63G 8/00* (2013.01); *B63G 8/001* (2013.01); *B63G 8/22* (2013.01); *H01L 35/00* (2013.01); *H01L 35/32* (2013.01); *H02K 5/132* (2013.01); *B63B 2035/4433* (2013.01); *B63B 2035/4466* (2013.01); *B63G 2008/002* (2013.01); *B63G 2008/004* (2013.01)

(58) Field of Classification Search
CPC .............. B63G 8/001; B63G 2008/002; B63G 2008/004; Y02E 10/30; Y02E 10/32; Y02E 10/34; Y02E 10/36; Y02E 10/38
See application file for complete search history.

(56) References Cited

U.S. PATENT DOCUMENTS

| | | | |
|---|---|---|---|
| 6,914,343 B2 | 7/2005 | Hiller et al. | |
| 7,012,554 B2 | 3/2006 | Hiller et al. | |
| 7,262,360 B1 * | 8/2007 | Davis ..................... | B63H 19/00 136/205 |

(Continued)

FOREIGN PATENT DOCUMENTS

KR    20120114454 A    10/2012

OTHER PUBLICATIONS

Webb, D. C., et. al., SLOCUM: An Underwater Glider Propelled by Environmental Energy, IEEE J. of Oceanic Engineering, vol. 26, No. 4, pp. 447-452, Oct. 2001.

(Continued)

*Primary Examiner* — Andrew Polay
(74) *Attorney, Agent, or Firm* — Felix L. Fischer

(57) ABSTRACT

An underwater energy harvesting drone has a primary hull to be submersibly received in ocean water and a plurality of thermoelectric modules, each module of said plurality of thermoelectric modules having a first operational interface in thermal contact with the primary hull. A thermal transfer element is in contact with a second operational interface on the plurality of thermoelectric modules and an electrical power storage device is connected to the plurality of thermoelectric modules. Positioning of the submersible primary hull to create a thermal gradient between the primary hull and the thermal transfer element induces electrical power generation by the thermoelectric modules thereby charging the electrical power storage device.

20 Claims, 11 Drawing Sheets

(56) References Cited

U.S. PATENT DOCUMENTS

| | | | |
|---|---|---|---|
| 7,649,138 | B2 | 1/2010 | Hiller et al. |
| 9,382,902 | B1 | 7/2016 | Hiller |
| 2008/0264323 | A1 | 10/2008 | Gosling |
| 2011/0179988 | A1* | 7/2011 | Howard ............... B63G 8/08 |
| | | | 114/337 |

OTHER PUBLICATIONS

Yuan, C., et. al., Marine Environmental Damage Effects of Solar Cell Panel, IEEE, Prognostics & System Health Management Conference, 2010.

Chirgwin, R, US Navy develops underwater wireless battery-charging tech, The Register, Aug. 29, 2017 available at https://www.theregister.co.uk/2017/08/29/us_navy_develops_underwater_wireless_batterycharging _tech/.

Bradley, A. and Feezor, M, Power Systems for Autonomous Underwater Vehicles, IEEE JOurnal of Oceanic Enbineering, vol. 26, No. 4, Oct. 2001.

* cited by examiner

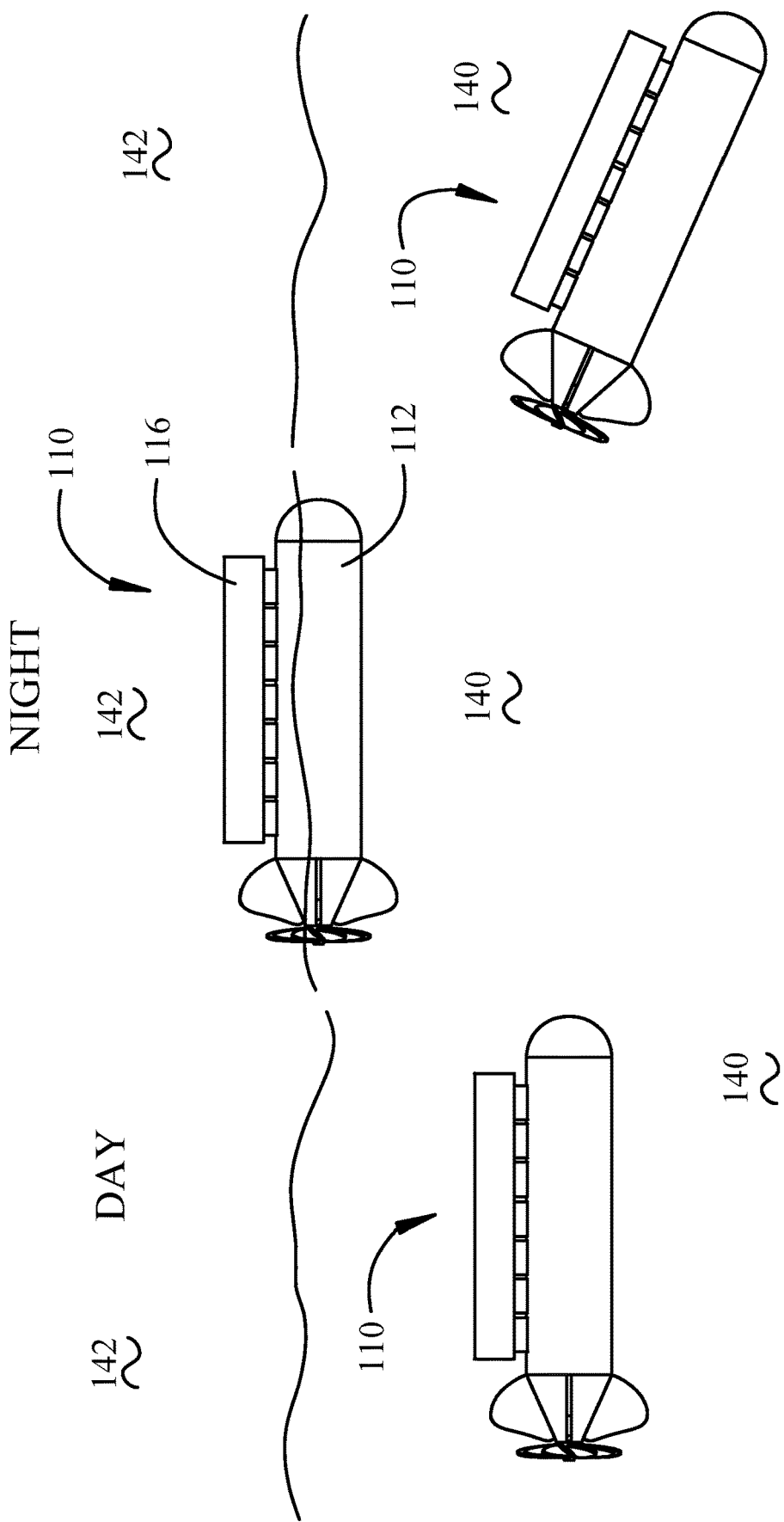

UNDERWATER ENERGY HARVESTING DRONE AND METHOD FOR OPERATION

BACKGROUND INFORMATION

Field

Implementations shown in the disclosure relate generally to underwater unmanned vehicles (UUV) and more particularly to UUVs employing thermoelectric systems to generate electrical power using temperature differential in the environment in which the UUV operates.

Background

UUVs are employed for various tasks in undersea exploration, environmental monitoring and security operations. Operational profiles for the UUVs make extended operating capability with limited refueling requirements attractive. Deep oceans are the ideal environment for covert military operations. Such operations are often relying on UUVs for combat and reconnaissance missions.

Certain prior art UUVs employ thermal gradients in the ocean thermocline for energy generation or propulsive effects. However, the thermocline asymptotically approaches a temperature of about 3.5 degrees Celsius at about 1000 Meters and below. UUVs relying on the gradient in the thermocline are therefore energy starved in the deep sea environment. Consequently, UUVs must frequently surface for refueling increasing their visibility and placing the UUV at potential risk of collision or course interruption with surface ships.

SUMMARY

Exemplary implementations provide an underwater energy harvesting drone having a primary hull to be submersibly received in ocean water and a plurality of thermoelectric modules, each module of said plurality of thermoelectric modules having a first operational interface in thermal contact with the primary hull. A thermal transfer element is in contact with a second operational interface on the plurality of thermoelectric modules and an electrical power storage device is connected to the plurality of thermoelectric modules. Positioning of the submersible primary hull to create a thermal gradient between the primary hull and the thermal transfer element induces electrical power generation by the thermoelectric modules thereby charging the electrical power storage device.

The exemplary implementations allow a first method for operation of an unmanned underwater vehicle (UUV) wherein cold ocean water is entrained into an internal storage tank in a first position. The internal storage tank is then placed in a second position to store the cold ocean water. The UUV is navigated to a hydrothermal vent location placing a primary hull into a "hot zone" compared to surrounding ocean water. Power is generated with thermoelectric modules based on the thermal gradient between the primary hull and internal storage tank to charge an electrical power storage.

The exemplary implementations allow a second method for operation of an unmanned underwater vehicle (UUV) wherein the submerged UUV is surfaced to expose a heat dissipater to the air. Thermoelectric modules are operated to provide electrical energy generation for charging of an electrical power storage device employing temperature differential between a primary hull immersed in ocean water and the heat dissipater in convective contact with the air.

BRIEF DESCRIPTION OF THE DRAWINGS

The features, functions, and advantages that have been discussed can be achieved independently in various implementations or may be combined in yet other implementations further details of which can be seen with reference to the following description and drawings.

FIGS. 7A, 7B and 7C are pictorial representations of the operational sequence for the second implementation;

DETAILED DESCRIPTION

The exemplary implementations for a UUV as described herein provide an underwater energy harvesting drone (UEHD), more generally described as an energy harvesting underwater vehicle, having a submersible primary hull in thermal contact with a first operational interface on a plurality of thermoelectric modules and a thermal transfer element in contact with a second operational interface on the plurality of thermoelectric modules whereby positioning of the UEHD to create a thermal gradient between the primary hull and the thermal transfer element induces electrical power generation by the thermoelectric modules.

Figure 1A:
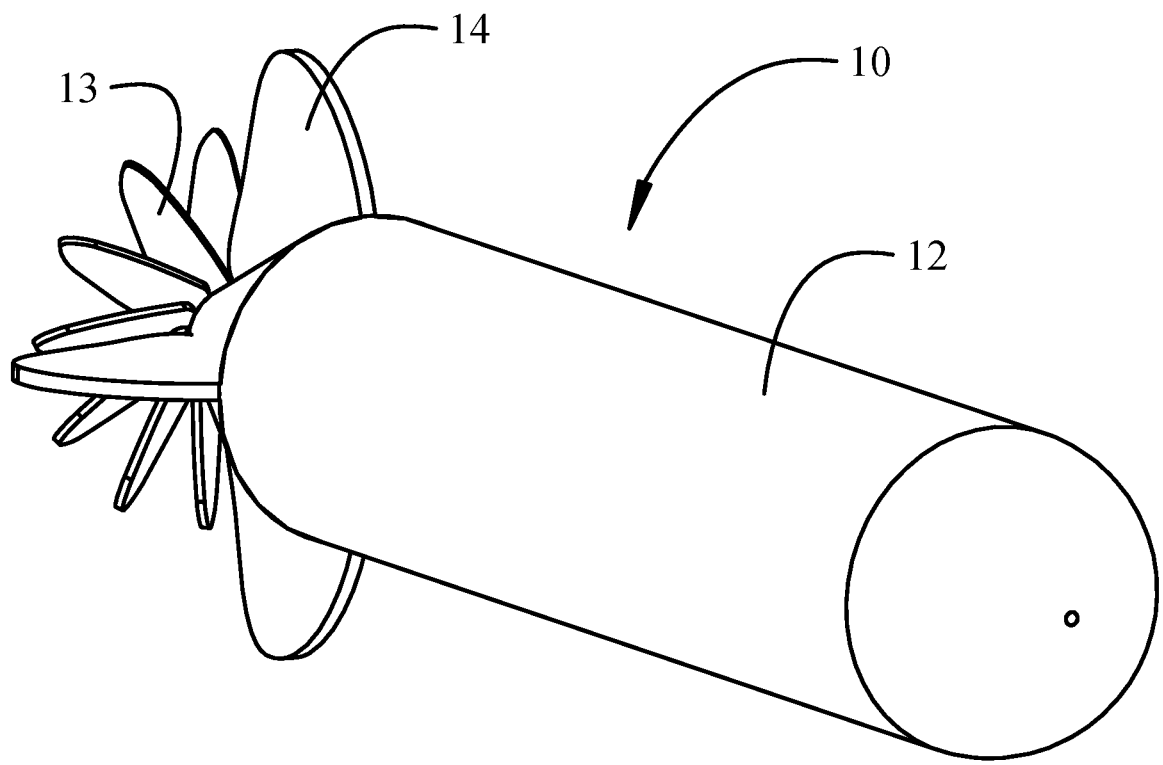
FIG. 1A is a pictorial representation of a UUV employing a first exemplary implementation as described herein.
Figure 2A:
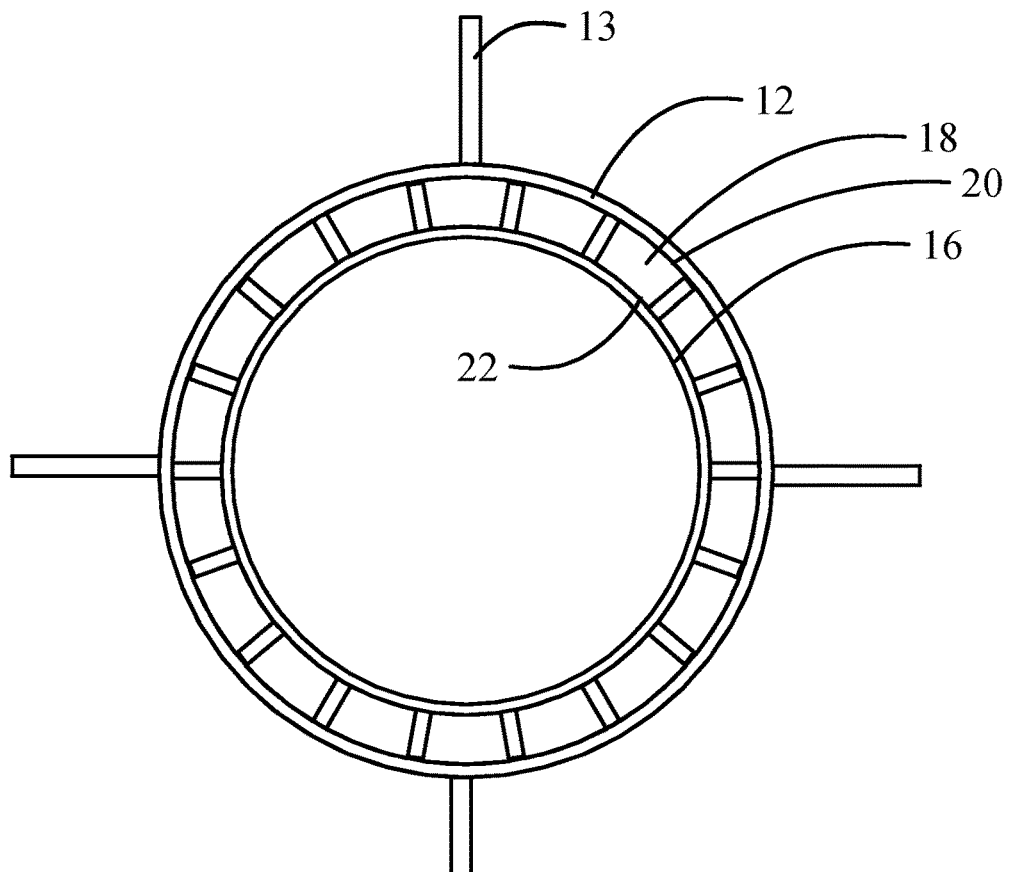
FIG. 2A is a front section view of the implementation of FIG. 1A.

Referring to the drawings, FIG. 1A shows a first implementation of the UEHD 10. The UEHD 10 has a primary hull 12 and is maneuvered (e.g. navigated) through an ocean environment with a propulsor 13 (shown as a standard multi-bladed screw as exemplary) and control planes 14 (e.g. control fins or hydrodynamic control surfaces) pivotally connected to the primary hull 12 for directional control of the UEHD 10. As seen in FIG. 2A, an internal storage tank 16, which is fillable with cold ocean water as will be described subsequently, is employed as a thermal transfer element. The internal storage tank 16 is substantially concentric within the primary hull 12 for the implementation shown and a plurality of thermoelectric modules 18 are mounted between the internal storage tank 16 and the primary hull 12 with a first operational surface 20 on each thermoelectric module 18 in thermal contact with the primary hull 12 and a second operational surface 22 in thermal contact with the internal storage tank 16. The thermoelectric modules may be selected from at least one of a Peltier junction device (Seebeck, Thompson effects) and a Sterling engine. A temperature differential between the primary hull 12 and the internal storage tank 16 will provide a thermal gradient for operation of the thermoelectric modules 18.

Figure 2B:
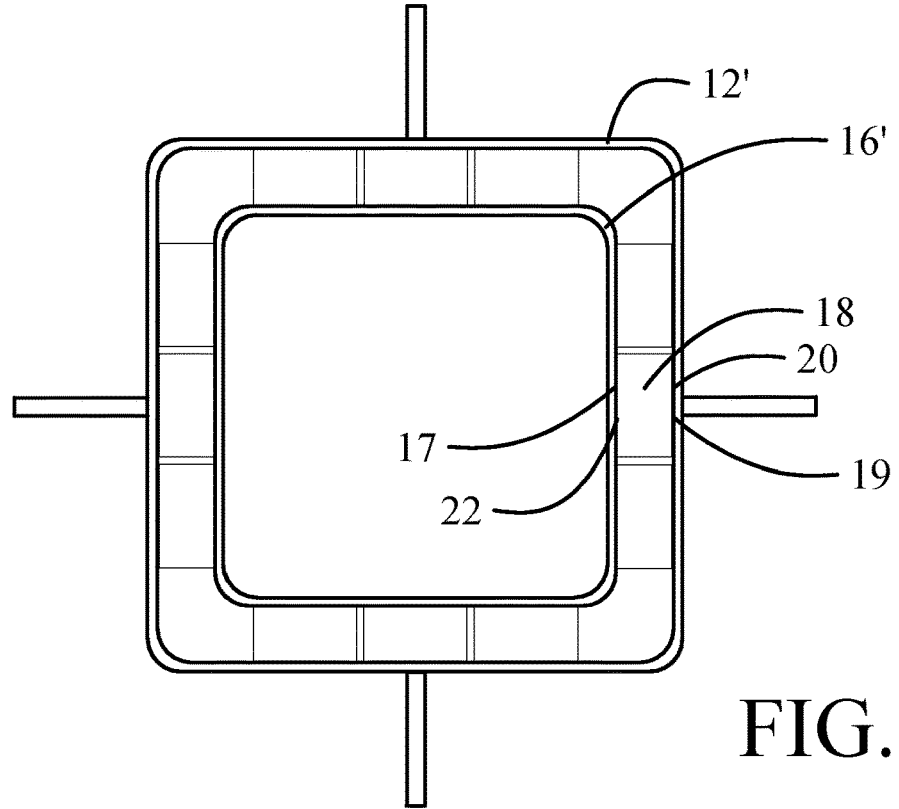
FIG. 2B is a front section view of a structural alternative for the first implementation with a rectangular profile.

The UEHD of FIG. 2A is substantially circular in the central cross section shown. An exemplary alternative implementation is shown in FIG. 2B wherein the central cross section is rectangular in shape with both the primary hull 12' and internal storage tank 16' having a rectangular cross section. The thermoelectric modules 18 are mounted intermediate the flat sides 17 of the storage tank 16' and the flat inner sides 19 of the primary hull 12' to achieve the desired thermal gradient.

Figure 3:
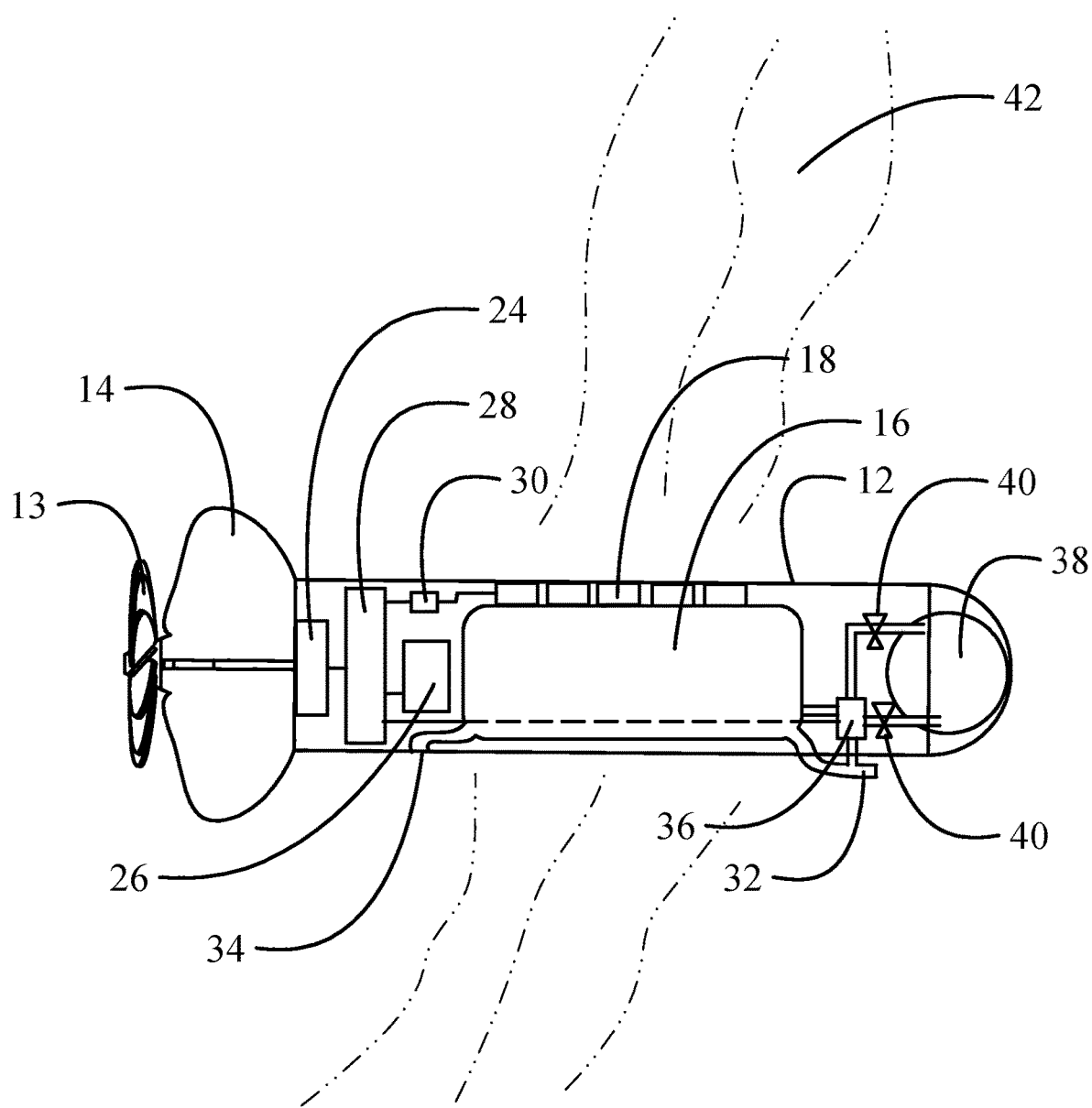
FIG. 3 is a schematic side cutaway view of the first implementation.

As seen in FIG. 3, the primary hull 12 houses an electrical motor 24 for the propulsor 13 and a control system 26 for operation and navigation of the UEHD 10. In particular, control system 26 operates both the propulsor 13 and one or more of the control planes 14 to propel and navigate UEHD 10 through water. An electrical power storage device 28, which may be a rechargeable battery including a single battery element, a bank of storage batteries such as Lithium Ion, Lithium Ion Polymer, Nickel Cadmium, Nickel Metal Hydride, Lead Acid, or a capacitive storage system such as a nano-technology supercapacitor, is connected through a voltage transformer circuit 30 to the thermoelectric modules 18 and the motor 24. Electrical power for the control system 26 may also be provided from the electrical power storage device 28.

The exemplary implementation shown in FIG. 3 has an inlet scoop 32 and a vent 34 connecting the internal storage tank 16 with ocean water on the exterior of the primary hull 12. The inlet scoop 32 and the vent 34 may be retractable or incorporate door closures for open and closed positions to allow selective fluid communication with the external ocean water. A pump 36 powered by the electrical power storage device 28 may be employed to pump water into the internal storage tank 16 from the inlet scoop 32 and out the vent 34 to exchange the water in the internal storage tank. Alternatively, the inlet scoop 32 and vent 34 may be opened to the external ocean water with the UEHD 10 underway allowing dynamic pressure of the water to create the flow through the internal storage tank 16. With the inlet scoop 32 and vent 34 in the closed position cold ocean water entrained into the internal storage tank 16 is stored.

In operation, the UEHD 10 is navigated either autonomously or remotely by the control system 26 pursuant to a navigational profile (included as a portion of the mission/ operation profile) to locations of hydrothermal vents near the ocean floor. A global distribution of hydrothermal vent fields is present throughout the world's oceans. Such thermal vents produce hot water plumes ranging in temperature from 60° to 646° C. With the UEHD 10 in open water the inlet scoop 32 and vent 34 are deployed or opened in a first position of the internal storage tank 16 and cold ocean water is entrained into the internal storage tank 16 and then held by closing the inlet scoop 32 and vent 34 placing the internal storage tank 16 in a second position to store the cold ocean water. With the UEHD at submerged depths of 500 meters and below water temperatures of 12° C. to 4° C. or less are available. The UEHD 10 is then navigated by the control system 26 to locate the primary hull 12 in a hydrothermal vent and either loiters in the hot plume of the vent or tracks the vent plume current to remain with the primary hull 12 positioned in a "hot zone" compared to surrounding ocean water and the initial temperature of the water stored in the internal storage tank 16. The temperature differential of the hot plume in convective and conductive contact with the primary hull 12 and the cold water stored with the internal storage tank 16 acting as a thermal capacitor provides a thermal gradient for operation of the thermoelectric modules 18 which generate power to charge the electrical power storage device 28. Operation of the thermoelectric modules will create warming of the water in the internal storage tank 16. When the temperature differential between the external vent plume and internal storage tank is decreased to a point where effective power generation by the thermoelectric modules ceases, the UEHD 10 is maneuvered by the control system 26 into open water and the internal storage tank 16 is exhausted and refilled by operation of the inlet scoop 32 and vent 34. The UEHD 10 may then be repositioned within the vent plume or moved to a different vent plume as necessary for recharging of the electrical power storage device 28. Between charging cycles, the UEHD 10 may be operated by the control system 26 on its intended mission profile.

Alternatively, the thermal gradient may be reversed by navigating the UEHD 10 into the plume of the thermal vent and opening the inlet scoop 32 and vent 34 to entrain hot water from the plume. The UEHD 10 is then navigated by the control system 26 into open cold ocean water and the temperature differential of the cold ocean water in convective and conductive contact with the primary hull 12 and the hot water from the plume stored with the internal storage tank 16 acting as a thermal capacitor provides a reversed thermal gradient for operation of the thermoelectric modules 18 which generate power to charge the electrical power storage device 28. Voltage transformer circuit 30 may be adapted to sense reversed current produced by the thermoelectric modules based on the reversed thermal gradient and provide rectification for charging of the electric power storage device 28. Operation of the thermoelectric modules will create cooling of the water in the internal storage tank 16. When the temperature differential between the internal storage tank and the external ocean water in contact with the primary hull 12 is decreased to a point where effective power generation by the thermoelectric modules ceases, the UEHD 10 is maneuvered by the control system 26 back to a thermal vent and the internal storage tank 16 is exhausted and refilled by operation of the inlet scoop 32 and vent 34.

The systems provided in the UEHD 10 allows "surfing" between hydrothermal vents to provide recharging of the electrical power storage device 28 for substantially uninterrupted operation in the mission profile. As described, the mission (e.g. operation) profile can include activities such as exploration, environmental monitoring and security operations.

Figure 4:
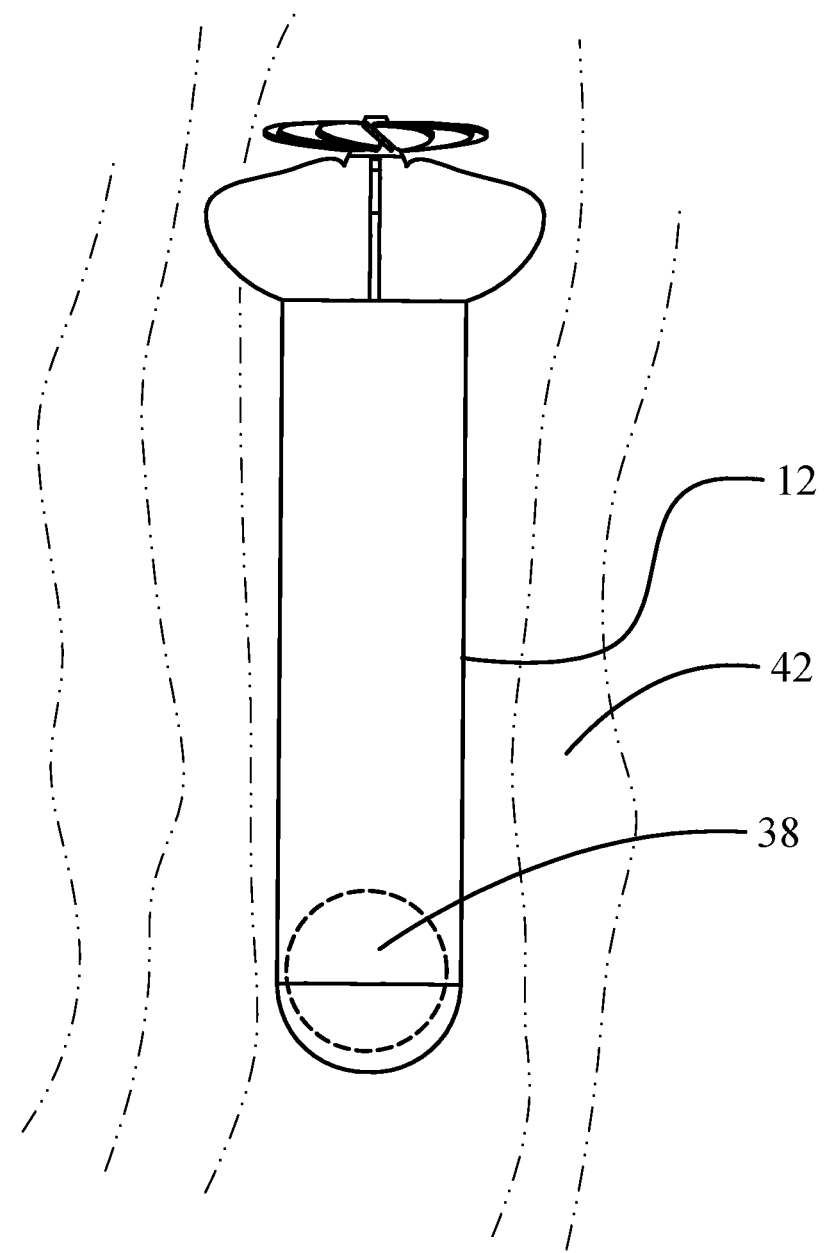
FIG. 4 is a side view of the first implementation in a "pogo" orientation.

Depending on the size of the UEHD 10 and other considerations, an orienting ballast tank 38 may be employed with appropriate control valves 40 and a pump or other venting system (including in an exemplary implementation use of the pump 36) to alter ballast of the UEHD 10 to selectively induce a vertical, or "pogo" orientation as shown in FIG. 4. The UEHD 10 may be maneuvered into the hydrothermal vent plume 42 and reoriented to the pogo position by filling the ballast tank 38 to provide greater exposure of the primary hull 12 to the vent plume if the internal storage tank 16 has been filled cold ocean water. Upon completion of the thermoelectric charging cycle or depletion of the temperature differential in the internal storage tank 16, water is expelled from the ballast tank 38 and the UEHD 10 is reoriented to its conventional operating orientation to provide normal cruising capability. The pogo orientation may also be employed to assist in filling the internal storage tank 16 with water from the plume if a negative temperature differential between the primary hull 12 and internal storage tank 16 is employed for the charging cycle.

Figure 5:
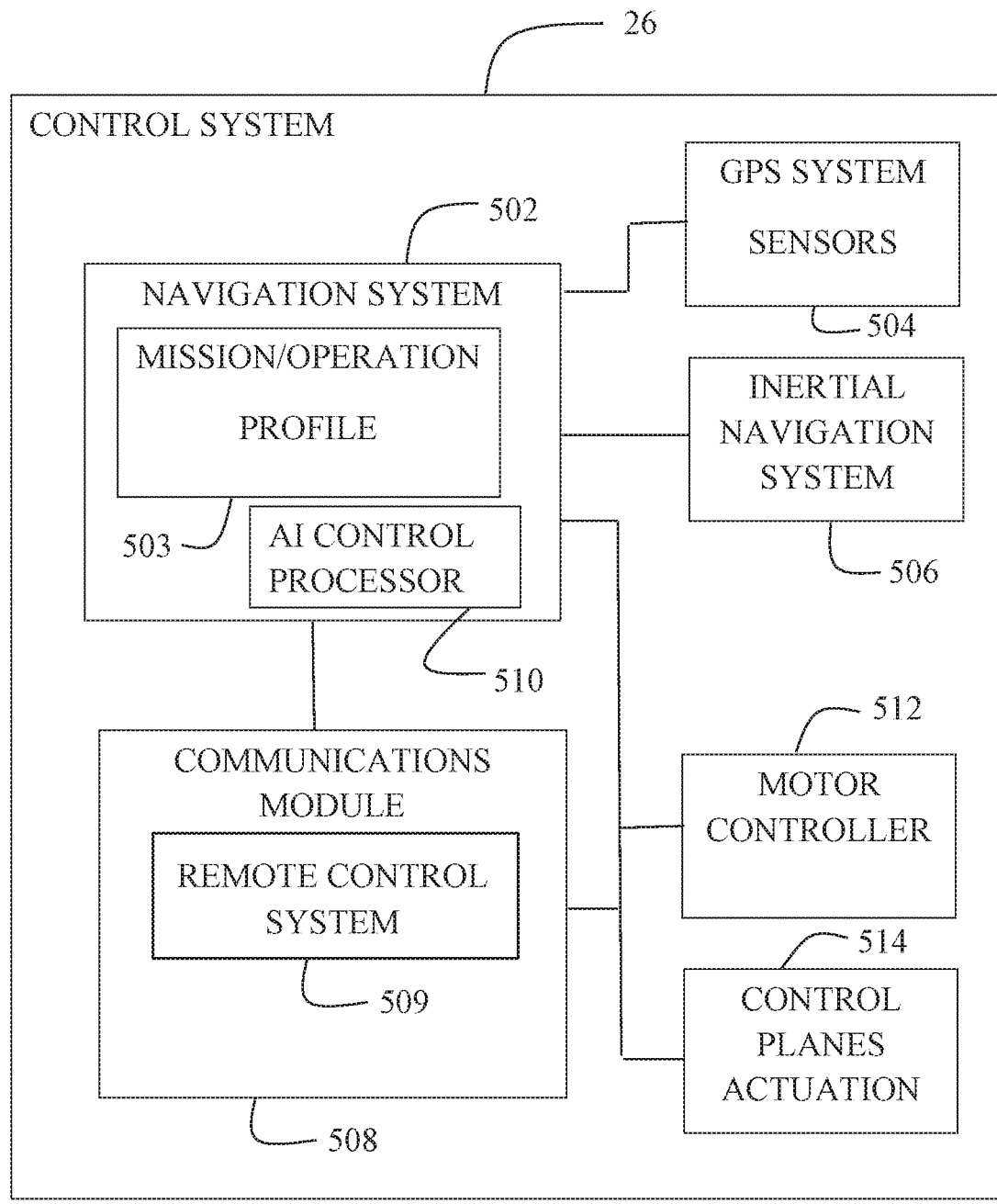
FIG. 5 is a block diagram of an exemplary control system with navigation and sensing components.

As seen in FIG. 5, the control system 26 incorporates a navigation system 502 that may be preloaded with a specific mission (e.g. operation) profile 503 for autonomous operation using input from a Global Positioning System (GPS) 504 or GPS sensors, inertial navigation (e.g. guidance) systems 506 or comparable navigation elements, or may be controlled remotely with a communications module 508 and a remote control system 509. Artificial intelligence (AI) may be incorporated in a control processor 510 for maneuvering or loitering within specified parameters in the mission profile. Control signals for physical control of the UEHD 10 by the control system 26 are provided through a motor controller 512 connected to the motor 24 and control planes actuation system 514 connected to the control planes 14.

Figure 1B:
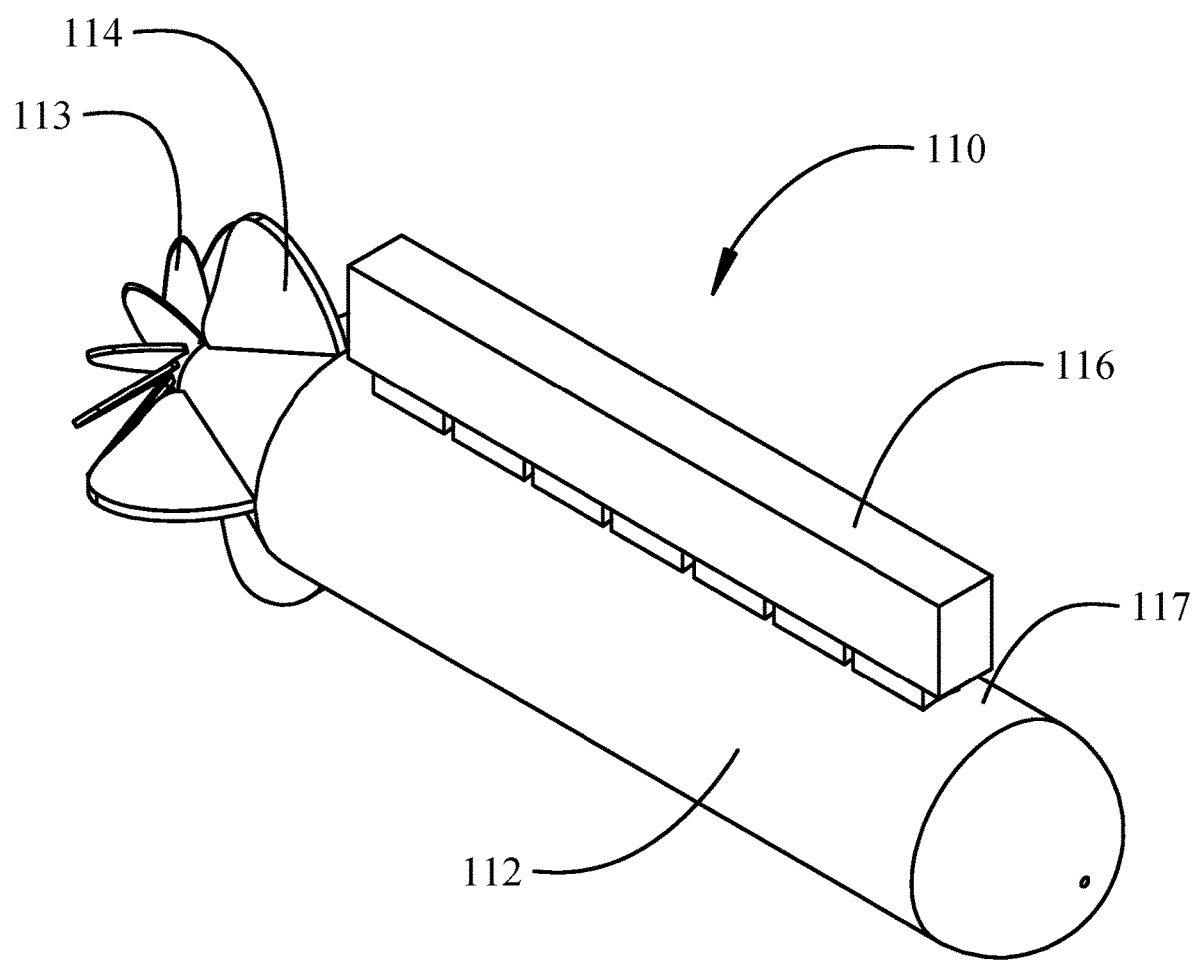
FIG. 1B is a pictorial representation of a UUV employing a second exemplary implementation as described herein.
Figure 6:
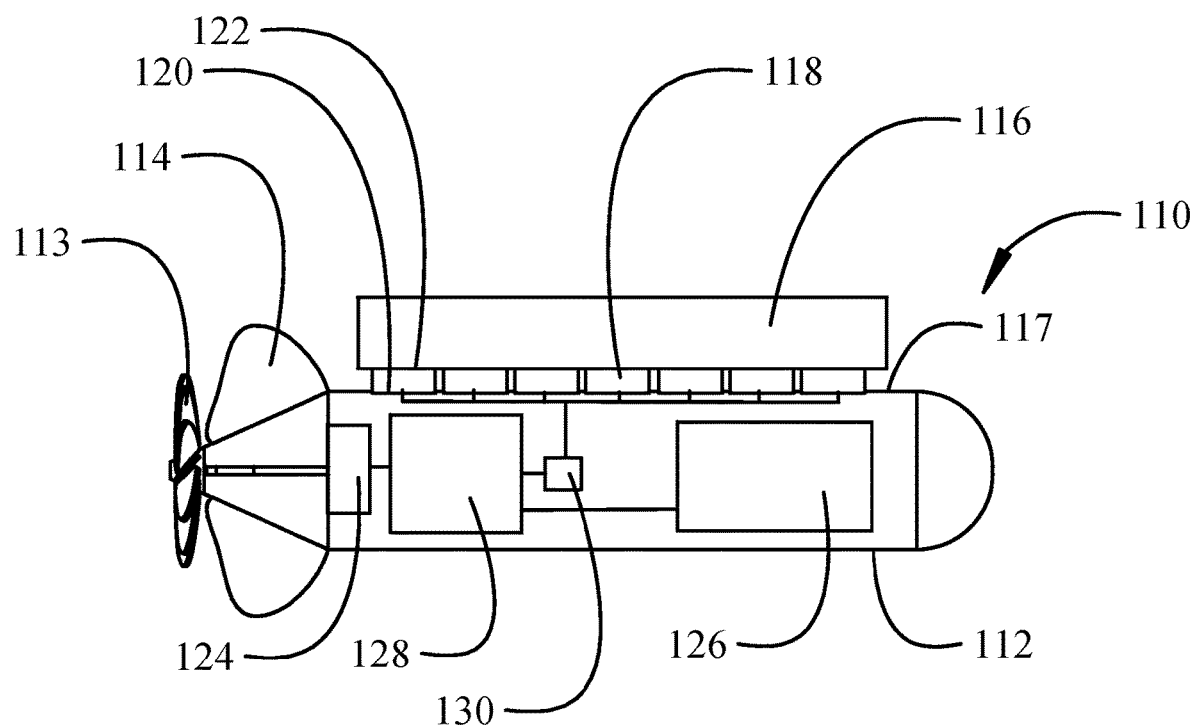
FIG. 6 is a schematic side cutaway view of the second implementation.

FIG. 1B demonstrates a second implementation of an UEHD 110. As with the first implementation, the UEHD 110 has a primary hull 112 and is maneuvered through an ocean environment with a propulsor 113 (shown as a standard multi-bladed screw as exemplary) and control planes 114. The thermal transfer element of the second implementation is a heat dissipater 116 mounted to and extending from a top surface 117 of the primary hull 112. The heat dissipater 116 may be telescopically extendible for increased surface area. As seen in FIG. 6, the primary hull 112 houses a motor 124 for the propulsor 113 and a control system 126 for operation of the UEHD 110. An electrical power storage device 128, which may be a single battery element, a bank of storage batteries such as Lithium Ion, Lithium Ion Polymer, Nickel Cadmium, Nickel Metal Hydride, Lead Acid, or a capacitive storage system such as a nano-technology supercapacitor, is connected through a voltage transformer circuit 130 to the thermoelectric modules 118 and the motor 124. Electrical power for the control system 126 may also be provided from the electrical power storage device 128. Thermoelectric modules 118 are connected with a first operational surface 120 on each thermoelectric module 118 in thermal contact with the primary hull 112 and a second operational surface 122 in thermal contact with the heat dissipater 116.

In operation of the second implementation as represented in FIGS. 7A-7C, UEHD 110 cruises in a submerged condition as shown in FIG. 7A pursuant to a mission profile established by the control system 126. Anticipated operation for the second implementation occurs in artic waters where ocean water temperature is relative constant, at least −2° C. or warmer while air temperatures, particularly at night, are significantly colder (approximately −20° C. but ranging from about −60° to −10° C.). When charging of the electrical power storage device 128 is required, control system 126 causes the UEHD 110 to surface as shown in FIG. 7B selectively exposing the heat dissipater 116 from the ocean water to the air. Temperature differential between the primary hull 112 immersed in ocean water 140 and the heat dissipater 116 in convective contact with surrounding air 142 is significant and sufficient for operation of the thermoelectric modules 118 to provide electrical energy generation for charging of the electrical power storage device. Upon completion of charging or as otherwise operationally desirable, the control system 126 causes the UEHD 110 to submerge for continuing operation as seen in FIG. 7C.

Various ballast tanks and associated operational systems for providing depth control of the disclosed implementations of the UEHD for diving, surfacing and desired operational depth are well known in the art and not described herein.

Figure 8A:
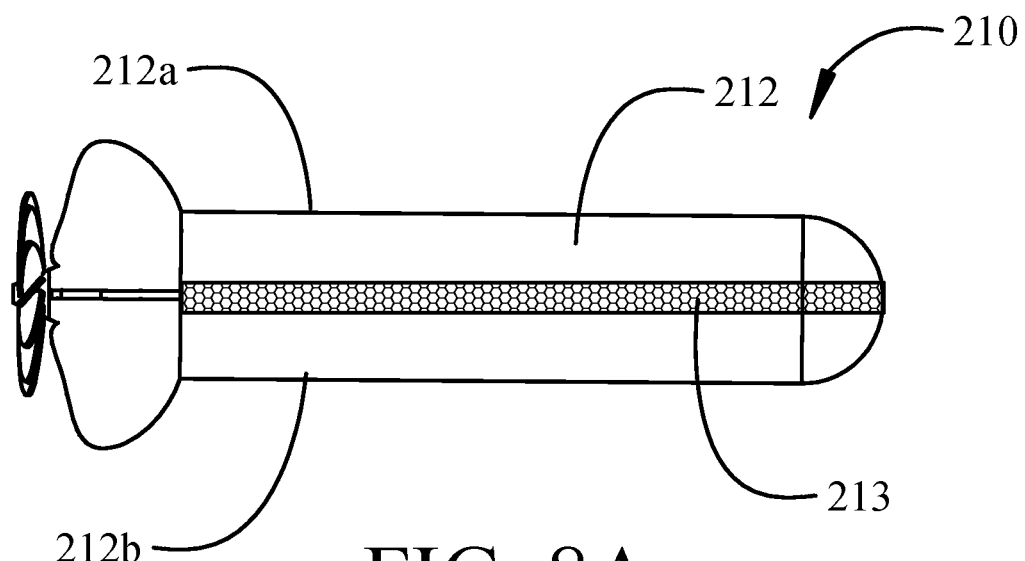
FIG. 8A is a side view of a structural alternative for the second implementation.
Figure 8B:
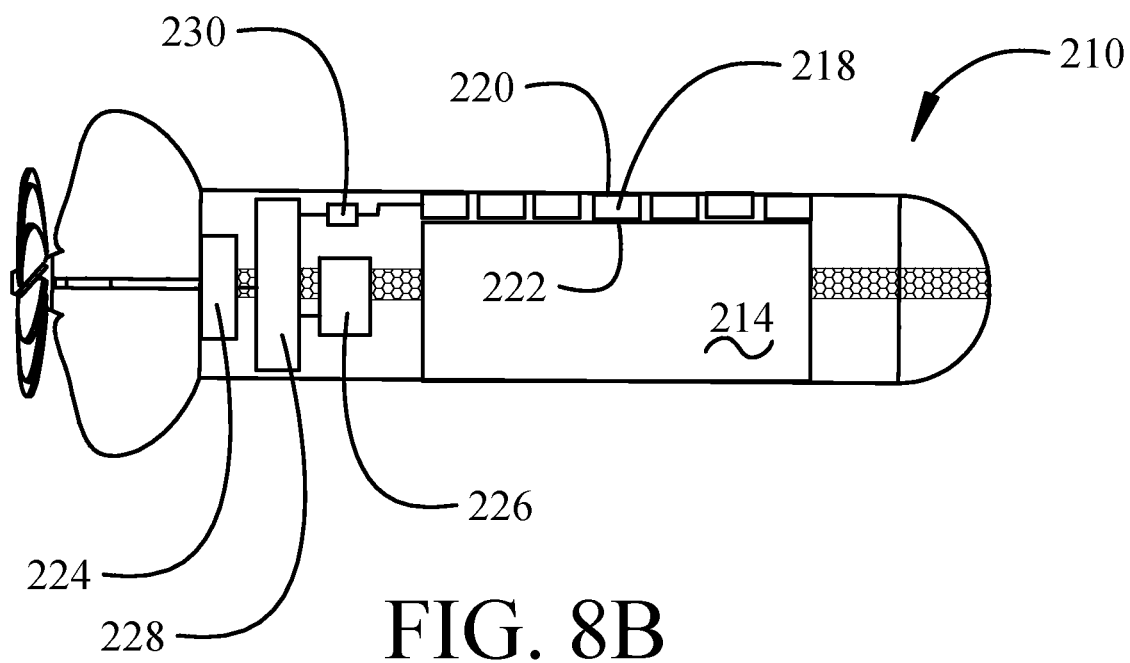
FIG. 8B is a schematic side cutaway view of the alternative for the second implementation.

An alternative structural arrangement for the second implementation is shown in FIGS. 8A and 8B. As seen in FIG. 8A, UEHD 210 incorporates a primary hull 212 which has an upper portion 212a and a lower portion 212b separated by an insulating barrier 213. While the hull portions 212a, 212b are shown as symmetrical above and below the insulating barrier 213 non-symmetrical arrangements may be employed. As seen in FIG. 8B, thermoelectric modules 218 are engaged with a first operational surface 220 on each thermoelectric module 218 in thermal contact the upper portion 212a and a second operational surface 222 in thermal contact with the lower portion 212b. A transfer plate 214 or other thermally conductive element may be employed for effective contact between the second operational surface 222 and the lower portion 212b or conversely between the first operational surface 220 and the upper portion 212a. As in the first structural arrangement, UEHD 210 incorporates a power storage device 228, voltage transformer circuit 230, motor 224 and control system 226. The UEHD 210 operates in a manner similar to the UEHD 110, surfacing to expose the upper portion 212a of the primary hull 212 to the air is a heat dissipater.

With either structural arrangement of the second implementation, the UEHD 110, 210 thermal transfer through the thermoelectric modules 118, 218 may be reversed if the air temperature is warmer than the water temperature thereby providing a reverse thermal gradient. When a reverse temperature gradient occurs the electrical current generated by the thermoelectric modules 118, 218 reverses direction. A diode circuit within the voltage transformer circuit 130, 230 is used to capture the reversed current and then store the charge in the electrical power storage device 128, 228.

Figure 9:
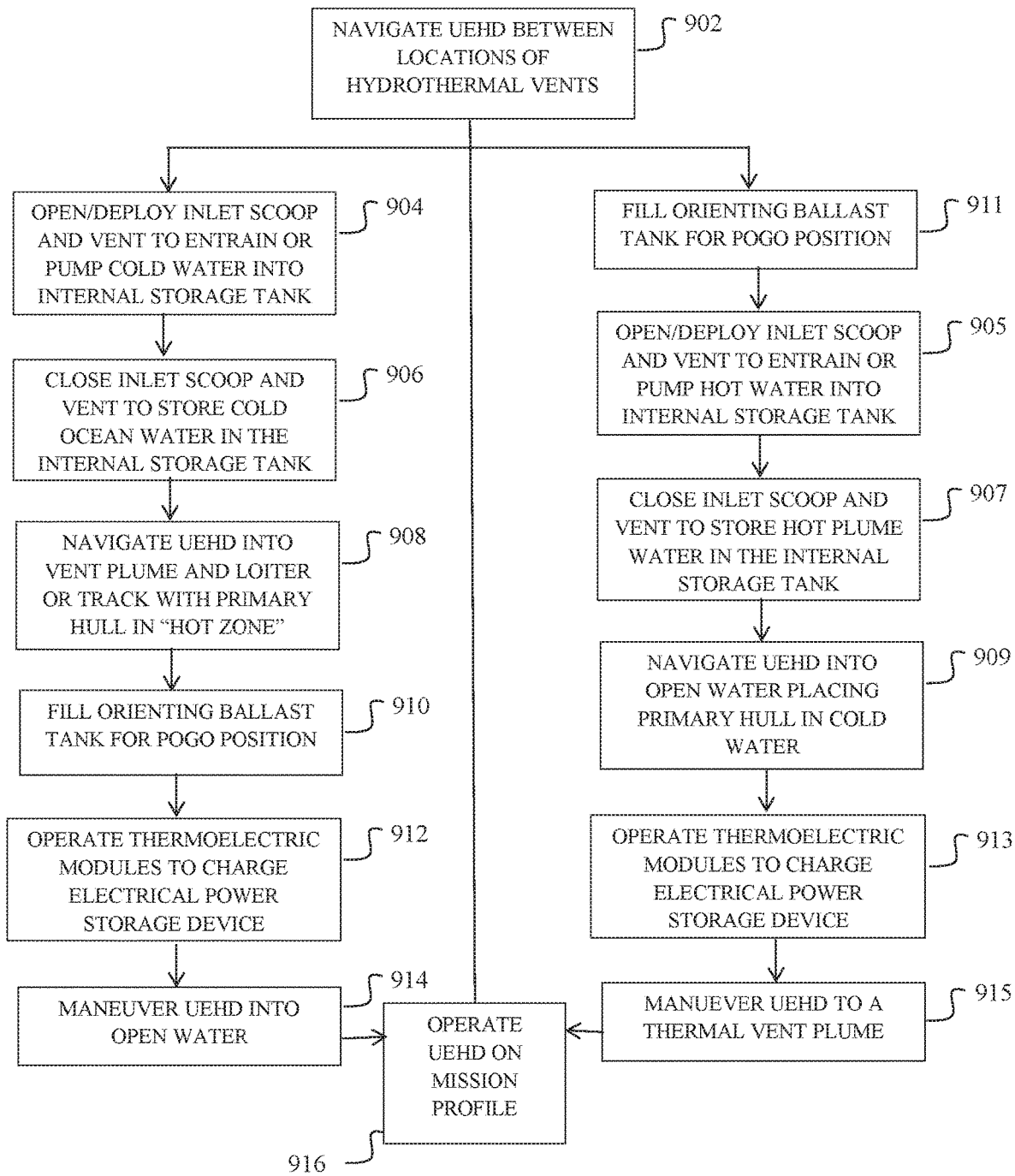
FIG. 9 is a flow chart showing a first method for electrical power generation for the first implementation; and, FIG. 10 is a flow chart showing a second method for electrical power generation for the second implementation.

The implementations of the UEHD as disclosed provide methods for operation of a UUV. As shown in FIG. 9 (with reference to FIGS. 1A and 3), the UEHD 10 is navigated either autonomously or remotely by the control system 26 between locations of hydrothermal vents near the ocean floor, step 902.

In a first sequence, with the UEHD 10 in open water the inlet scoop 32 and vent 34 are deployed or placed in an open position and cold ocean water is entrained by pumping or dynamic pressure into the internal storage tank 16 in a first position, step 904, and the inlet scoop 32 and vent 34 are then closed, step 906, placing the internal storage tank 16 in a second position to store the cold ocean water. The UEHD 10 is navigated by the control system 26 to a hydrothermal vent location and either loiters with the primary hull 12 in the hot plume of the vent or tracks the vent plume current to remain with the primary hull 12 in a "hot zone" compared to surrounding ocean water and the initial temperature of the water in the internal storage tank 16, step 908. The orienting ballast tank 38 may be filled, step 910, orienting the UEHD 10 in a pogo position. In this manner, orienting ballast tank 38 is filled for orienting the UEHD in the pogo position. The temperature differential of the hot plume in convective and conductive contact with the primary hull 12 and the cold water stored with the internal storage tank 16 acting as a thermal capacitor, provides a thermal gradient for the thermoelectric modules 18 which are operated based on the thermal gradient between the primary hull and internal storage tank to generate power to charge the electrical power storage device 28, step 912. The UEHD 10 is maneuvered by the control system 26 into open water, step 914, and the internal storage tank 16 is exhausted and refilled by operation of the inlet scoop 32 and vent 34, step 904, to repeat the process of the first sequence.

In a second sequence, with the UEHD 10 in the vent plume the orienting ballast tank 38 may be filled, step 911, orienting the UEHD 10 in a pogo position. The inlet scoop 32 and vent 34 are deployed or opened and hot water from the plume is entrained by pumping or dynamic pressure into the internal storage tank 16 in the first position, step 905, and the inlet scoop 32 and vent 34 are then closed, step 907, placing the internal storage tank 16 in a second position (e.g. rotated relative to the pogo position) to store the hot water. The UEHD 10 is navigated by the control system 26 out of the vent plume and into the open ocean where cold water provides a negative temperature differential with respect to the initial temperature of the hot water in the internal storage tank 16, step 909. The temperature differential of the cold open ocean water in convective and conductive contact with the primary hull 12 and the hot water stored with the internal storage tank 16 acting as a thermal capacitor, provides the thermal gradient and the thermoelectric modules 18 are operated based on the thermal gradient between the primary hull and internal storage tank to generate power to charge the electrical power storage device 28, step 913. The UEHD 10 is maneuvered by the control system 26 back to a hydrothermal vent plume, step 915, and the internal storage tank 16 is exhausted and refilled by operation of the inlet scoop 32 and vent 34, step 905, to repeat the process of the second sequence. With either sequence, the UEHD may then be operated in the desired mission profile, step 916, in concert with navigating and operating the thermoelectric modules (18, 118, 218) to charge the electrical power storage devices (28, 128, 228). The UEHD 10 may be repositioned within the vent plume or moved to a different vent plume as necessary for recharging of the electrical power storage device 28 beginning with step 904, 905.

Figure 10:
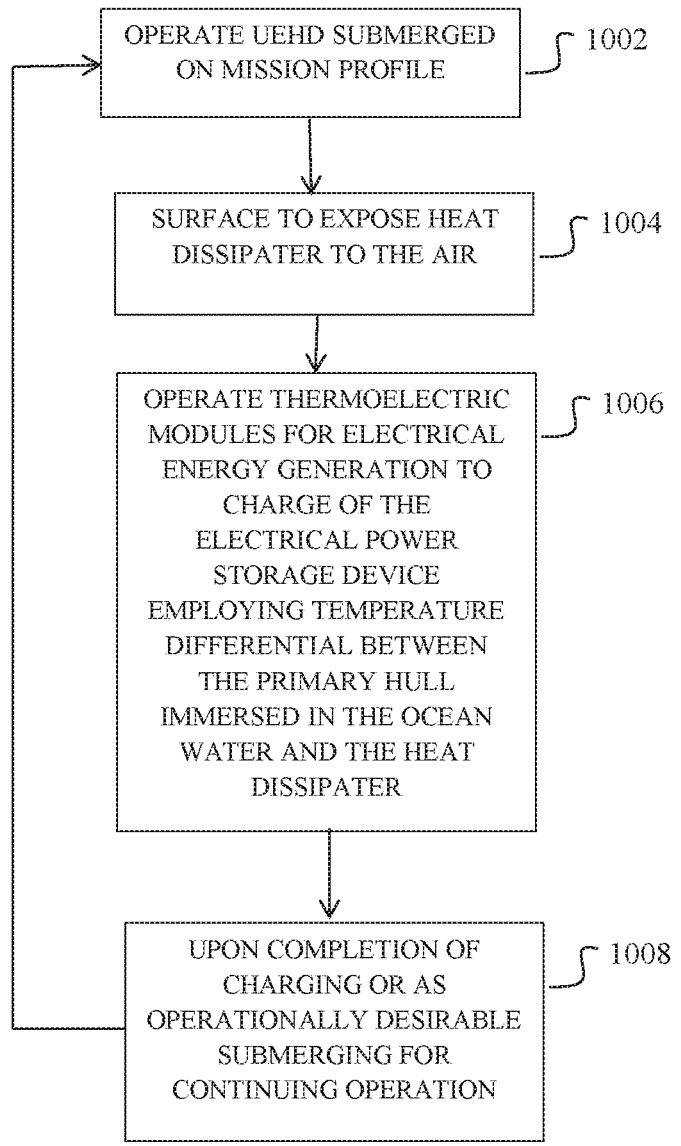

As shown in FIG. 10 (with reference to FIGS. 1B, 6 and 8A-B), the UEHD 110, 210 is operated submerged on a mission profile directed by the control system 126, step 1002. When charging of the electrical power storage device 128 is required, control system 126 causes the UEHD 110, 210 to surface, step 1004, exposing the heat dissipater 116, 212a to the air. The thermoelectric modules 118 are operated to provide electrical energy generation for charging of the electrical power storage device employing temperature differential between the primary hull 112 (or 212b) immersed in the ocean water 140 and the heat dissipater 116, 212a in convective contact with the surrounding air 142, step 1006. Upon completion of charging or as otherwise operationally desirable, the control system 126 causes the UEHD 110 to submerge for continuing operation, step 1008.

Having now described various implementations in detail as required by the patent statutes, those skilled in the art will recognize modifications and substitutions to the specific implementations disclosed herein. Such modifications are within the scope and intent of the present invention as defined in the following claims.

What is claimed is:

1. An underwater energy harvesting drone comprising:
a primary hull to be submersibly received in ocean water;
a plurality of thermoelectric modules each module of said plurality of thermoelectric modules having a first operational interface in thermal contact with the primary hull;
a thermal transfer element comprising an internal storage tank adapted to receive cold ocean water in a first position and store the cold ocean water in a second position, said thermal transfer element in contact with a second operational interface on the plurality of thermoelectric modules;
an electrical power storage device connected to the plurality of thermoelectric modules; wherein positioning of the primary hull to create a thermal gradient between the primary hull and the thermal transfer element induces electrical power generation by the thermoelectric modules thereby charging the electrical power storage device;
an electrical motor connected to receive power from the electrical power storage device;
a propulsor driven by said electrical motor;
control planes engaged to the primary hull; and,
a control system adapted to provide control signals to the electrical motor and control planes pursuant to a navigational profile to locate the primary hull in a hot plume of a hydrothermal vent.

2. The underwater energy harvesting drone as defined in claim 1 wherein the electrical power storage device includes at least one of a rechargeable battery and a capacitor.

3. The underwater energy harvesting drone as defined in claim 2 wherein the battery is one of a Lithium Ion, a Lithium Ion Polymer, a Nickel Cadmium, a Nickel Metal Hydride, or a Lead Acid battery.

4. The underwater energy harvesting drone as defined in claim 2 wherein the capacitor comprises a nano-technology supercapacitor.

5. The underwater energy harvesting drone as defined in claim 1 wherein the thermoelectric modules include at least one of a Peltier junction device and a Sterling engine.

6. The underwater energy harvesting drone as defined in claim 1 wherein the internal storage tank includes an inlet scoop and a vent, said inlet scoop and vent having an open position for the first position of the internal storage tank and a closed position placing the internal storage tank in the second position.

7. The underwater energy harvesting drone as defined in claim 1 further comprising a ballast tank adapted to selectively induce a pogo position of the primary hull.

8. The underwater energy harvesting drone as defined in claim 1 wherein the thermal the internal storage tank is further adapted to received hot water from the hot plume of the hydrothermal vent in the first position when the navigational profile locates the primary hull in the hot plume and store the hot water in the second position when the navigational profile locates the primary hull in cold ocean water, thereby inducing a reversed thermal gradient for operation of the thermoelectric modules to generate power to charge the electrical power storage device and a transformer circuit is adapted to sense reversed current produced by the thermoelectric modules based on the reversed thermal gradient and provide rectification for charging of the electric power storage device.

9. An underwater energy harvesting drone comprising:
a primary hull to be submersibly received in ocean water;
a plurality of thermoelectric modules each module of said plurality of thermoelectric modules having a first operational interface in thermal contact with the primary hull;
a thermal transfer element comprising a heat dissipater mounted to and extending from a top surface of the primary hull and in contact with a second operational interface on the plurality of thermoelectric modules;
an electrical power storage device connected to the plurality of thermoelectric modules; wherein positioning of the primary hull to create a thermal gradient between the primary hull and the thermal transfer element induces electrical power generation by the thermoelectric modules thereby charging the electrical power storage device;

an electrical motor connected to receive power from the electrical power storage device;

a propulsor driven by said electrical motor;

control planes engaged to the primary hull; and, a control system adapted to provide control signals to the electrical motor and control planes pursuant to a navigational profile, the navigational profile causing selective surfacing of the primary hull to expose the heat dissipater from the ocean water.

10. The underwater energy harvesting drone as defined in claim 9 wherein the primary hull comprises an upper portion and a lower portion, said upper portion and lower portion separated by an insulating barrier, wherein the upper portion comprises the thermal transfer element and the navigational profile causes selective surfacing of the primary hull to expose the upper portion from the ocean water.

11. A method for operation of an unmanned underwater vehicle (UUV) comprising:

entraining cold ocean water into a thermal transfer element in a primary hull to be submersibly received in ocean water, said primary hull housing a plurality of thermoelectric modules each module of said plurality of thermoelectric modules having a first operational interface in thermal contact with the primary hull, wherein the thermal transfer element comprises an integral storage tank internal storage tank adapted to receive cold water in a first position and store the cold ocean water in a second position, said thermal transfer element in contact with a second operational interface on the plurality of thermoelectric modules;

placing the internal storage tank in the second position to store the cold ocean water;

navigating the UUV with an electrical power storage device connected to the plurality of thermoelectric modules and an electrical motor connected to receive power from the electrical power storage device;

a propulsor driven by said electrical motor;

control planes engaged to the primary hull; and, a control system adapted to provide control signals to the electrical motor and control planes pursuant to a navigational profile to a hydrothermal vent location placing the primary hull into a vent plume "hot zone" compared to surrounding ocean water; and, generating power with thermoelectric modules based on a thermal gradient between the primary hull and internal storage tank to charge the electrical power storage device wherein placing of the primary hull in the vent plume creates the thermal gradient between the primary hull and the thermal transfer element.

12. The method as defined in claim 11 further comprising filing an orienting ballast tank to orient the UUV in a pogo position.

13. The method as defined in claim 11 further comprising: maneuvering into open water;

exhausting the internal storage tank; and, refilling the internal storage tank by operation of an inlet scoop and a vent.

14. The method as defined in claim 11 further comprising operating the UUV in a desired mission profile.

15. The method as defined in claim 14 further comprising:

repositioning within the vent plume or moving to a different vent plume for recharging of the electrical power storage device.

16. A method for operation of an unmanned underwater vehicle (UUV) comprising:

surfacing to expose a thermal transfer element on a primary hull to open air, said primary hull to be submersibly received in ocean water and said primary hull housing a plurality of thermoelectric modules each module of said plurality of thermoelectric modules having a first operational interface in thermal contact with the primary hull, wherein the thermal transfer element comprises a heat dissipater mounted to and extended from a top surface of the primary hull and in contact with a second operational interface on the plurality of thermoelectric modules, wherein an electrical power storage device is connected to the plurality of thermoelectrical modules and an electrical motor is connected to receive power from the electrical power storage device, a propulsor is driven by said electrical motor and control planes are engaged to the primary hull and a control system is adapted to provide control signals to the electrical motor and control planes pursuant to a navigational profile to selectively cause the surfacing;

and, operating the thermoelectric modules to provide electrical energy generation for charging of an electrical power storage device employing temperature differential between a primary hull immersed in ocean water and the heat dissipater in convective contact with the open air.

17. The method as defined in claim 16 further comprising submerging the UUV upon completion of charging.

18. The method as defined in claim 16 further comprising operating submerged on a mission profile directed by a control system.

19. The underwater energy harvesting drone as defined in claim 1 wherein the internal storage tank includes an inlet scoop and a vent, said inlet scoop and vent having an open position for the first position of the internal storage tank and a closed position placing the internal storage tank in the second position and further comprising a ballast tank adapted to selectively induce a pogo position of the primary hull.

20. The underwater energy harvesting drone as defined in claim 1 wherein the electrical power storage device includes at least one of a rechargeable battery, selected from the set of a Lithium Ion, a Lithium Ion Polymer, a Nickel Cadmium, a Nickel Metal Hydride, or a Lead Acid battery, and a nanotechnology supercapacitor.

* * * * *